US012690136B2

(12) United States Patent
Darmawikarta et al.

(10) Patent No.: US 12,690,136 B2
(45) Date of Patent: Jul. 21, 2026

(54) EMBEDDED PASSIVES WITH CAVITY SIDEWALL INTERCONNECT IN GLASS CORE ARCHITECTURE

(71) Applicant: Intel Corporation, Santa Clara, CA (US)

(72) Inventors: Kristof Darmawikarta, Chandler, AZ (US); Srinivas Venkata Ramanuja Pietambaram, Chandler, AZ (US); Tarek A. Ibrahim, Mesa, AZ (US); Cary Kuliasha, Mesa, AZ (US); Siddharth K. Alur, Chandler, AZ (US); Jung Kyu Han, Chandler, AZ (US); Beomseok Choi, Chandler, AZ (US); Russell K. Mortensen, Chandler, AZ (US); Andrew Collins, Chandler, AZ (US); Haobo Chen, Chandler, AZ (US); Brandon C. Marin, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/956,338

(22) Filed: Sep. 29, 2022

(65) Prior Publication Data

US 2024/0114622 A1 Apr. 4, 2024

(51) Int. Cl.
| | |
|---|---|
| *H05K 1/185* | (2026.01) |
| *H05K 3/00* | (2006.01) |
| *H05K 3/46* | (2006.01) |
| *H10W 44/00* | (2026.01) |
| *H10W 70/60* | (2026.01) |
| *H10W 70/685* | (2026.01) |
| *H10W 90/00* | (2026.01) |

(52) U.S. Cl.
CPC ........... *H05K 1/185* (2013.01); *H05K 3/0047* (2013.01); *H05K 3/4644* (2013.01); *H10W 44/501* (2026.01); *H10W 70/614* (2026.01); *H10W 70/685* (2026.01); *H10W 90/00* (2026.01); *H05K 2201/1003* (2013.01); *H05K 2201/10674* (2013.01)

(58) Field of Classification Search
None
See application file for complete search history.

(56) References Cited

U.S. PATENT DOCUMENTS

| | | | | |
|---|---|---|---|---|
| 9,230,944 B1 * | 1/2016 | Lambert | .................. | H01G 4/38 |
| 2021/0313276 A1 * | 10/2021 | Lee | ......................... | H01L 23/13 |

* cited by examiner

*Primary Examiner* — Timothy J Thompson
*Assistant Examiner* — John B Freal
(74) *Attorney, Agent, or Firm* — Essential Patents Group, LLP

(57) ABSTRACT

An electronic device includes a substrate including a core layer; a cavity formed in the core layer, wherein the cavity includes sidewalls plated with a conductive material; a prefabricated passive electronic component disposed in the cavity; and a cavity sidewall connection providing electrical continuity from the plated cavity sidewalls to a first surface of the substrate and to a second surface of the substrate.

20 Claims, 17 Drawing Sheets

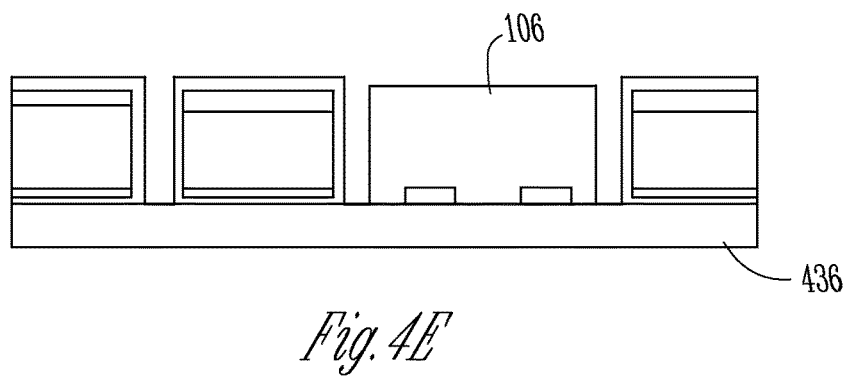
*Fig. 4E*
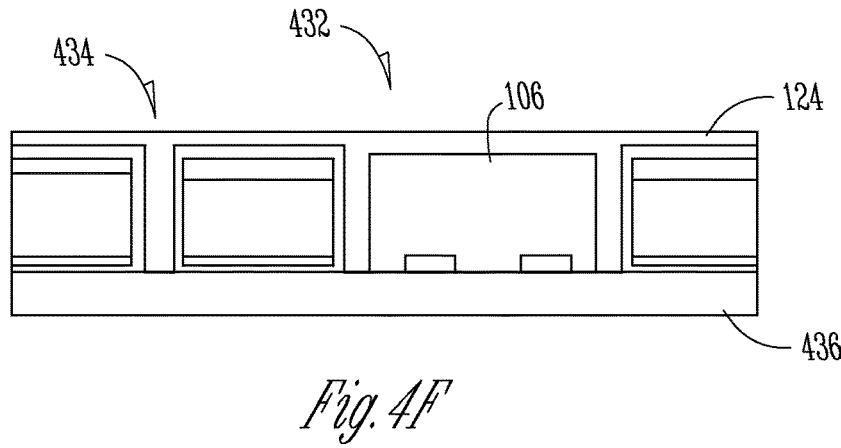
*Fig. 4F*
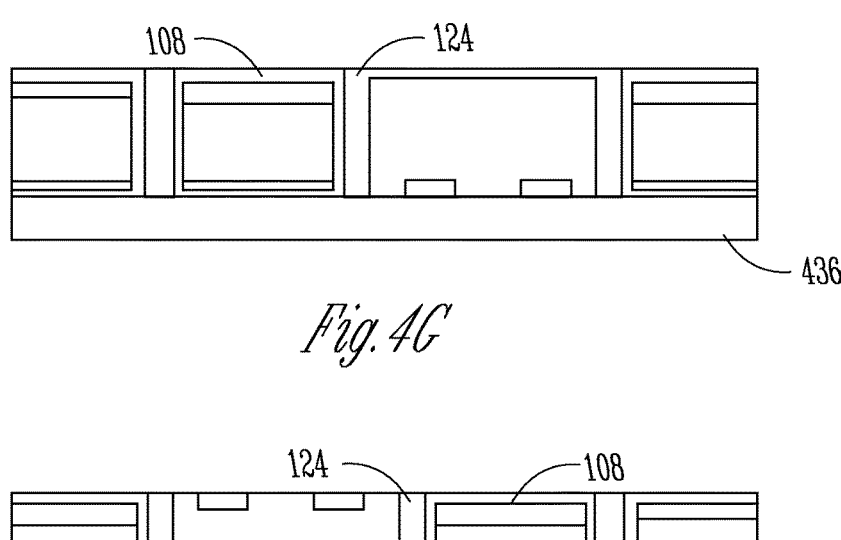
*Fig. 4G*
*Fig. 4H*

EMBEDDED PASSIVES WITH CAVITY SIDEWALL INTERCONNECT IN GLASS CORE ARCHITECTURE

TECHNICAL FIELD

Embodiments pertain to packaging of electronic systems. Some embodiments relate to techniques of including electronic passive devices in the package substrate.

BACKGROUND

Electronic systems can include voltage regulators that are packaged with integrated circuits (ICs) of the systems to provide power for the ICs. As electronic systems increase in complexity it is desired to keep their size small. This leads to increased density of electronic circuits by reducing their size to include more circuits in the same size or smaller package. Voltage regulators often include passive devices such as inductors for energy storage. It is challenging to reduce the size of passive devices and maintain their electrical properties such as their inductance for example.

BRIEF DESCRIPTION OF THE DRAWINGS

FIGS. 4A-4K illustrate a flow diagram of an example of a method of manufacture of an electronic device in accordance with some embodiments;

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

To meet the demand for increased functional complexity in smaller devices, manufacturers integrate multiple integrated circuit (IC) dies in a single electronic package to create an efficient electronic system in a package. The electronic systems use voltage regulators to provide stable voltages to the ICs. Voltage regulators may include passive devices such as one or both of inductors and capacitors to store energy. Electronic packaging can include a substrate core upon which interconnect build-up layers are formed with interconnect for ICs of the packed electronic system. To save space, the passive devices can be constructed or formed within the substrate core. However, this approach is becoming challenging as manufacturers further try to scale down and decrease the size of electronic circuits such as voltage regulators to increase circuit density of the electronic systems. An approach to reducing the size of circuits with passive devices is to embed prefabricated passive devices in the core material of the package substrate.

Figure 1:
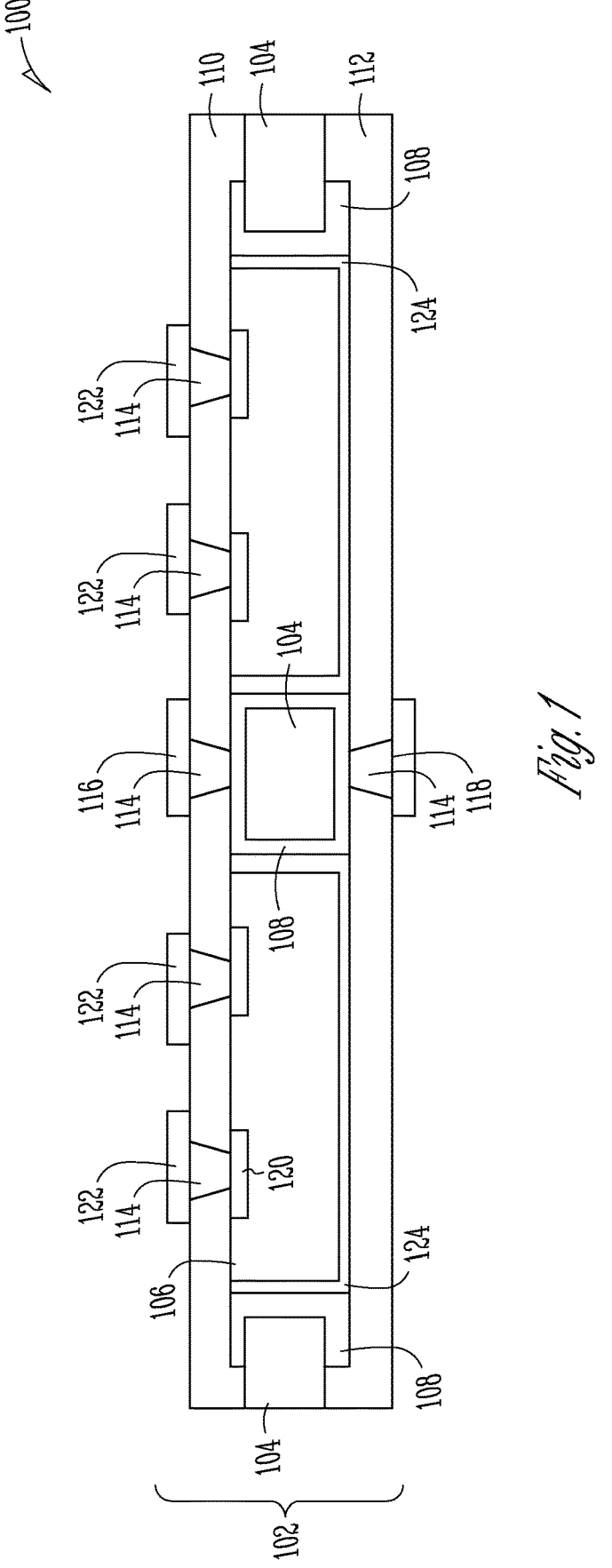
FIG. 1 is an illustration of a cross section side view of an example of an electronic device in accordance with some embodiments.

FIG. 1 is an illustration of a cross section side view of an example of an electronic device 100. The device 100 includes a substrate 102 (e.g., a package substrate) that includes a core layer 104. The core layer 104 may be a glass core layer. The glass core layer may include a silicate-based glass (e.g., lithium-silicate, borosilicate, aluminum silicate, etc.). In variations, the glass of the glass core layer is a lower quality glass (e.g., glass made with soda lime), or a higher quality glass (e.g., quartz glass made with fused silica).

One or more cavities are formed in the core layer 102 and a passive component 106, such as a prefabricated passive component, is disposed in the cavities. The passive components 106 may be discrete inductors or discrete capacitors or a combination of inductors and capacitors. In that sense, a prefabricated or discrete passive is distinct from an integrated passive formed in situ in the cavity. The cavities have sidewalls, and at least a portion of the sidewalls of the cavities in the core layer 102 include a conductive material 108 to form cavity sidewall connections. The conductive material 108 may be a metal (e.g., copper, aluminum, etc.). The cavity sidewall connection includes a cap of the conductive material 108 on the top surface and the bottom surface of the core layer 104 and contacting the conductive portion of the sidewalls.

In the example of FIG. 1, the substrate 102 includes a top dielectric layer 110 on the top surface of the core layer 104 and a bottom dielectric layer 112 on the bottom surface of the core layer 104. Vias 114 are formed through the dielectric layers to a top surface contact pad 116 and a bottom surface contact pad 118. The cavity sidewall connection provides electrical continuity from the plated cavity sidewalls to the top surface contact pad 116 of the substrate 102 and the bottom surface contact pad 118 of the substrate 102.

This provides a small footprint connection between the top and back side of the substrate 102. The substrate 102 may include more than one dielectric layer above or below the core layer 104. In certain examples, the substrate 102 can include a redistribution layer (RDL) above or below the core layer 104.

The passive components 106 in the cavities can be discrete components. The discrete components include two electrical contacts 120 on the top side of the component. Vias 114 provide electrical continuity to top surface contact pads 122. A mold layer 124 can be disposed between the discrete components and the plated sidewalls of the cavities. The discrete components can be discrete inductors used in one or more voltage regulator circuits. Other components of the voltage regulator circuits can be included in one or more integrated circuits (ICs) mounted on the substrate 102 and connected to the discrete inductors. The small footprint cavity sidewall connections can be used to provide power between the top side of the substrate 102 and the bottom side of the substrate 102.

Figure 2:
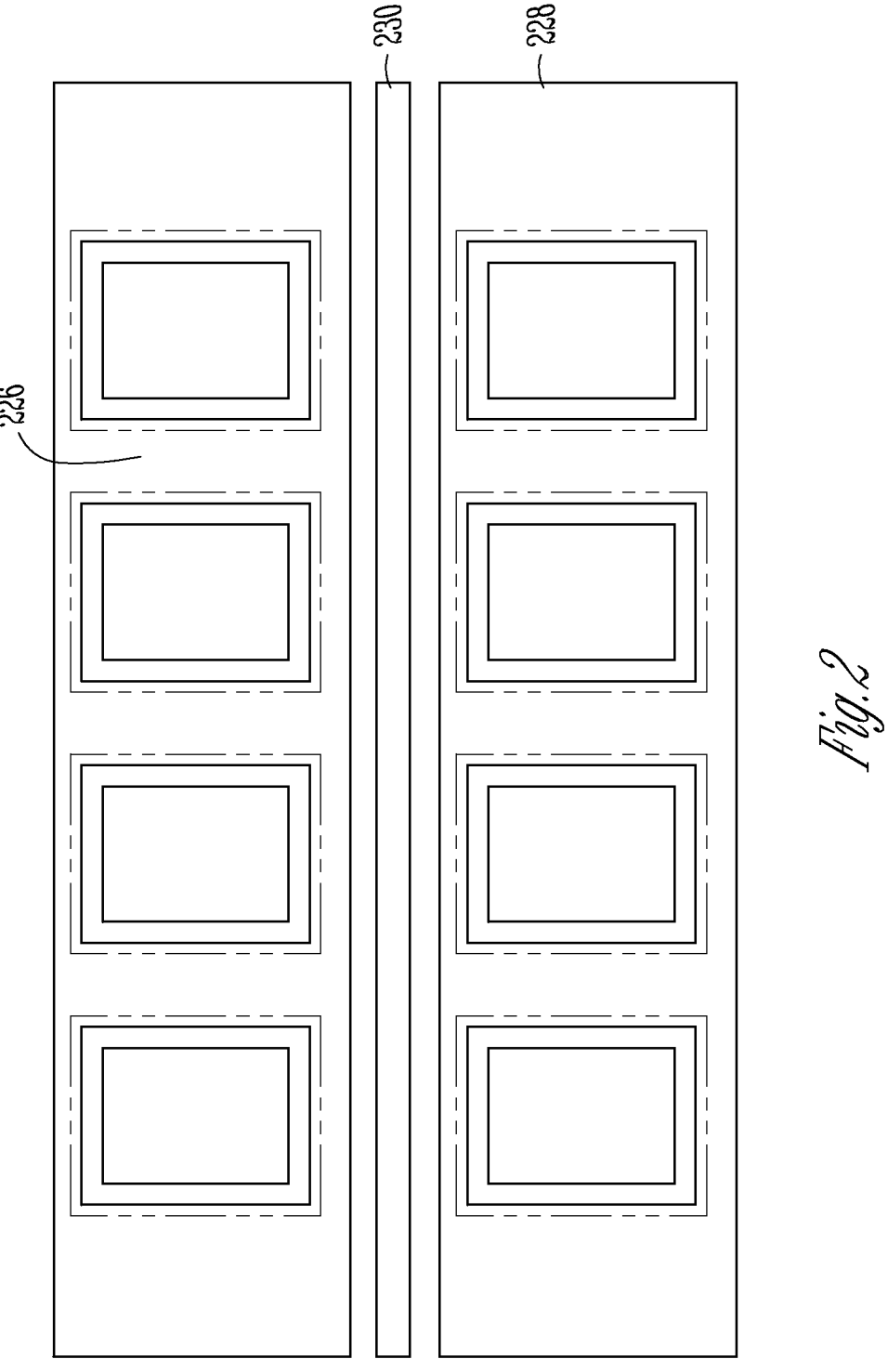
FIG. 2 is a top view of an electronics package substrate having cavity sidewall connections and discrete passive components in accordance with some embodiments.

FIG. 2 is a top view of a substrate 202 having cavity sidewall connections and discrete passive components 106. The top surface contact pads 116 of some of the cavity sidewall connections are connected to a metal plane 226 (e.g., a copper plane) to connect multiple cavity sidewall connections to a single net. Another metal plane 228 connects more of the cavity sidewall connections into a second net. The two metal planes 226, 228 are separated by a third net 230.

Figures 3A, 3B, 3C, 3D, 3E:
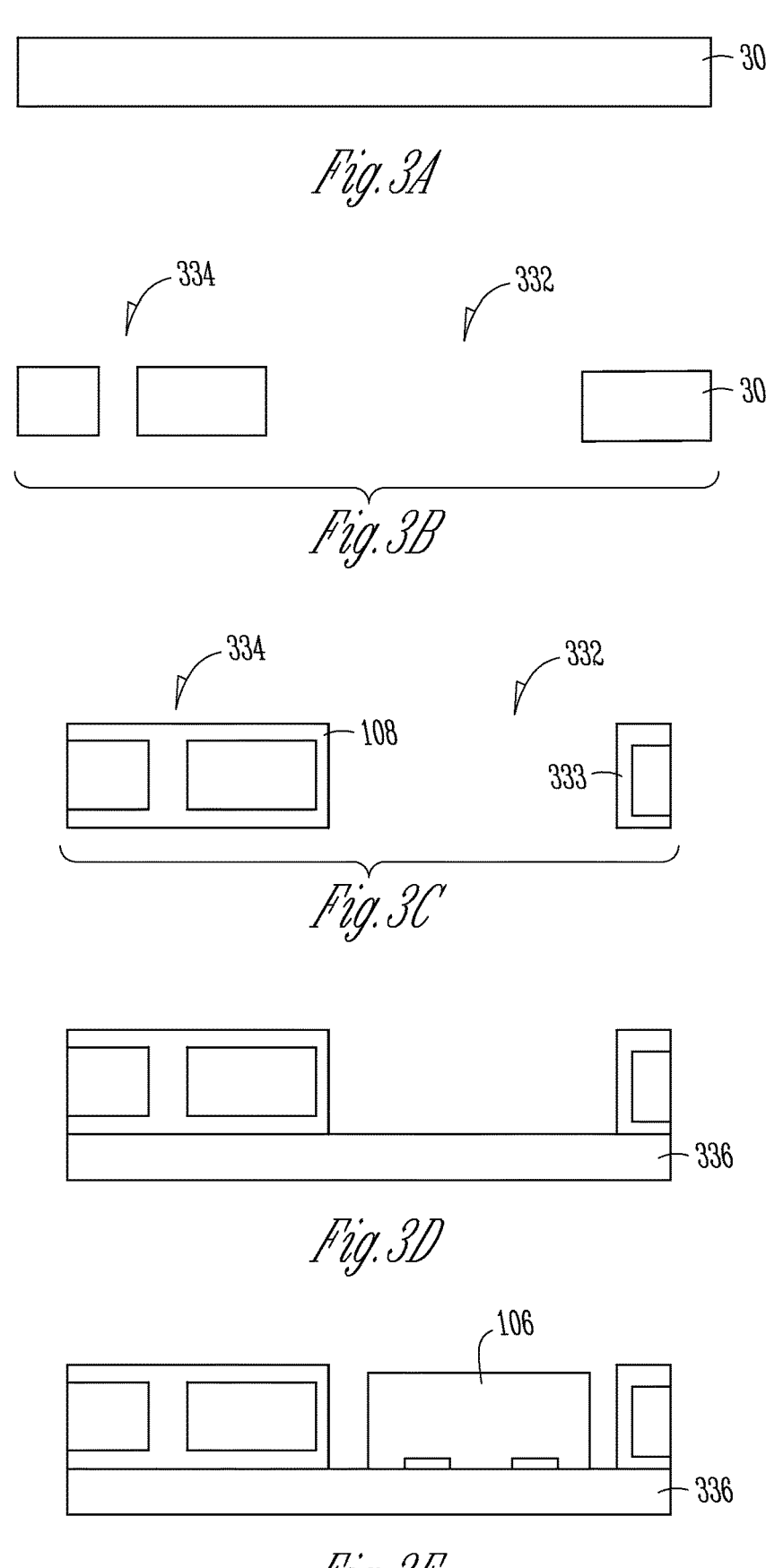
FIGS. 3A-3J illustrate a flow diagram of an example of a method of manufacture of an electronic device in accordance with some embodiments.

FIGS. 3A-3J illustrate a flow diagram of an example of a method of manufacture of an electronic device, such as the electronic device 100 of FIG. 1. FIG. 3A is a side view of a glass core layer 304 for the substrate of the electronic device 100. In FIG. 3B, a cavity 332 is formed in the glass core layer 304. An opening 334 is also formed for a through glass via (TGV). The cavity 332 has a larger width (e.g., diameter) than the opening 334 for the TGV. The cavity 332 and opening 334 may be formed by drilling (e.g., laser drilling).

In FIG. 3C, the sidewalls 333 of cavity 332 are coated with a conductive material 108 (e.g., a metal such as copper) and the opening 334 for the TGV is filled with the conductive material 108. For example, in some embodiments, copper may be plated on the sidewalls 333 of cavity 332 to form conductive material 108. Other methods may be used to dispose the conductive material 108 to form the conductive sidewalls 333. In FIG. 3D, the glass core is attached to a carrier 336 or temporary film. In FIG. 3E, a discrete passive electronic component 106 is disposed in the cavity 332.

Figures 3F, 3G, 3H, 3I, 3J:
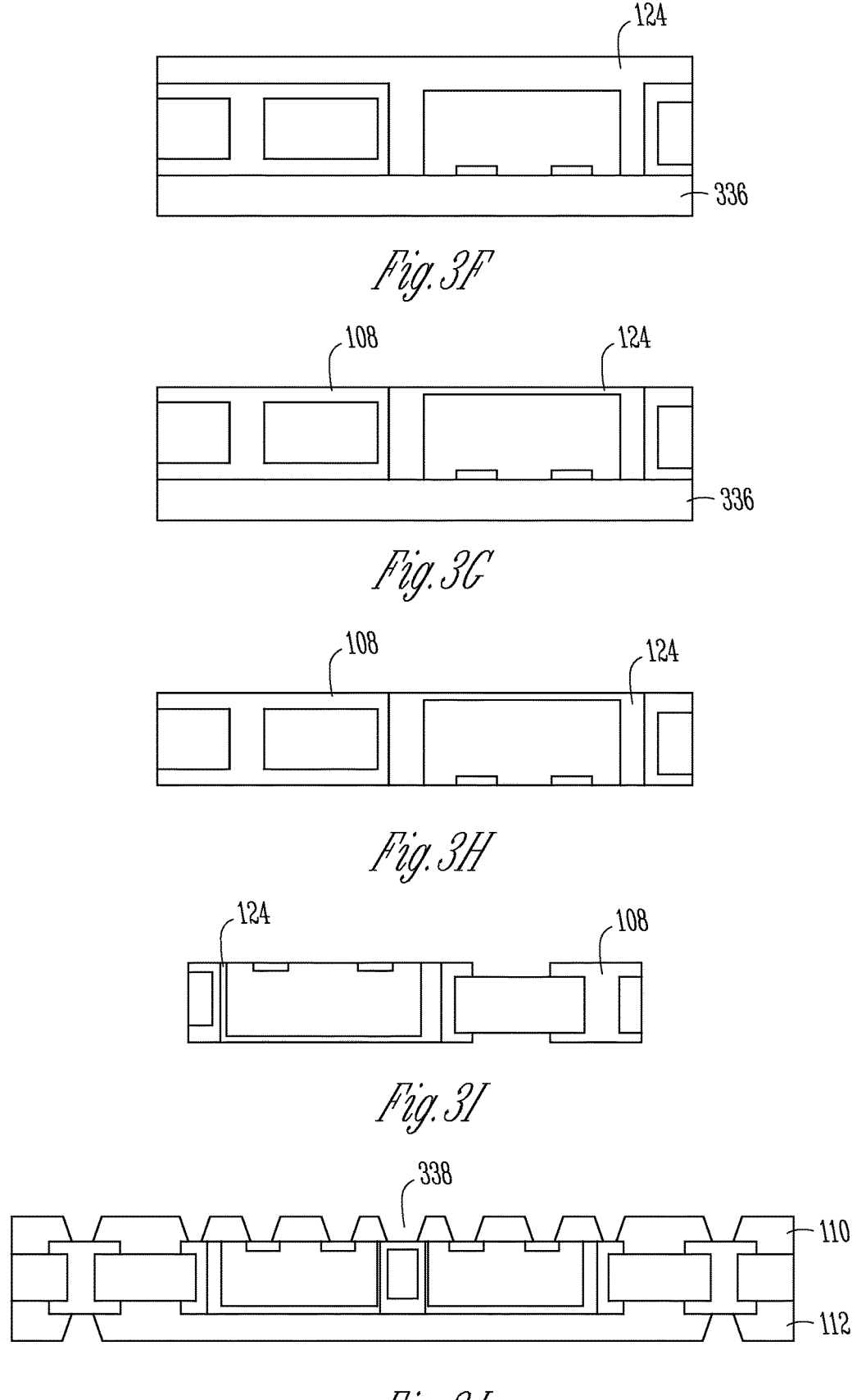

In FIG. 3F, a mold material 124 is disposed to encapsulate the plated cavity 332, the plated glass core layer 304, and the prefabricated passive electronic component 106. The mold material 124 may have a low coefficient of thermal expansion (CTE). In some embodiments, the mold material 124 may include epoxy resins, phenolic hardeners, silicas, catalysts, pigments, and/or mold release agents. In FIG. 3G, the mold material 124 is ground down to the conductive material 108. In FIG. 3H, the carrier 336 is removed. FIG. 3I shows the substrate assembly flipped and with portions of the conductive material 108 removed from the surfaces of the substrate assembly. FIG. 3J shows the dielectric layers 110 and 112 added to the top and bottom surfaces of the substrate assembly, and openings formed in the dielectric layers for vias 114. Metal for the vias 114 and contact pads 116, 118, 122, can be disposed on the dielectric layers, such as by a plating process or a sputtering process.

FIGS. 4A-4K illustrate a flow diagram of another example of a method of manufacture of an electronic device, such as the electronic device 100 of FIG. 1, but without a glass core layer. Instead, the substrate of the electronic device includes an organic core layer made of an organic material (e.g., a glass-reinforced epoxy laminate material such as FR-4).

Figure 4A:
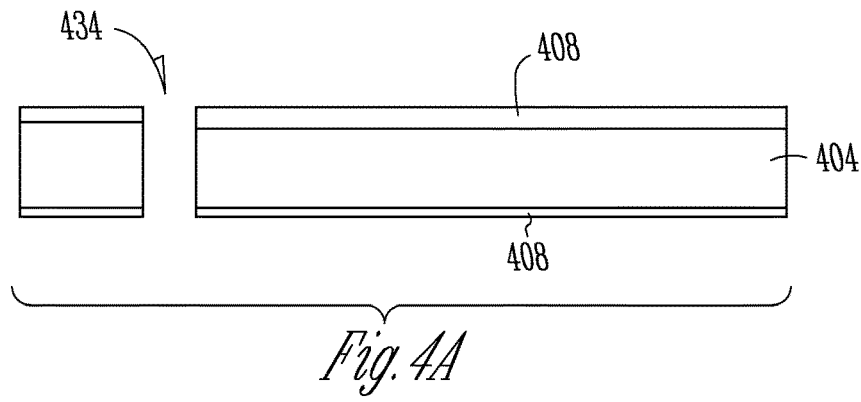
Figure 4B:
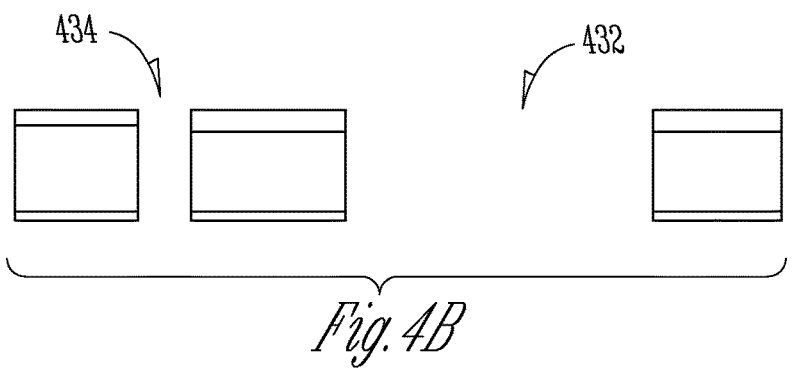

FIG. 4A is a side view of an organic core layer 404 for the substrate of the electronic device 100. The top surface and the bottom surface of the core layer 404 are plated with a conductive material 408 (e.g., metal foil). The core layer 404 also includes an opening 434 for a through via. In FIG. 4B, a cavity 432 is formed in the core layer 404. The cavity 432 has a larger width than the opening 434 for the through via. The cavity 432 and opening 434 may be formed by drilling.

Figure 4C:
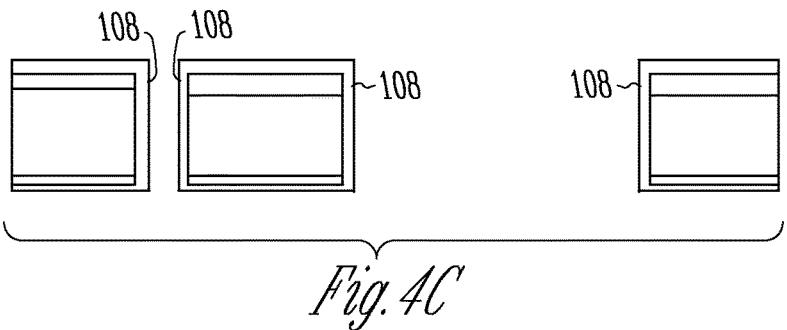
Figure 4D:
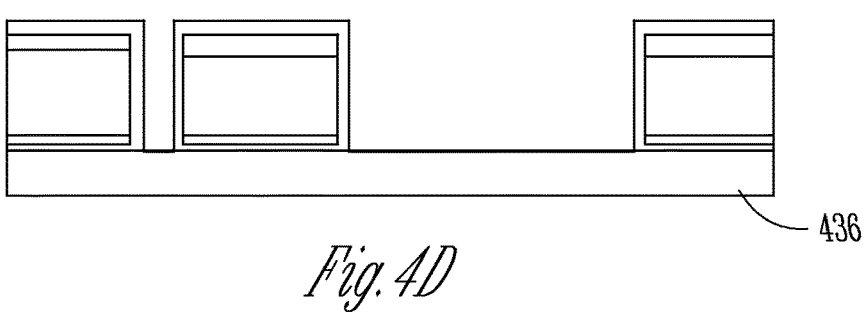

In FIG. 4C, the sidewalls of cavity 432 and the opening 434 are plated with a conductive material 108 (e.g., a metal) that can be the same as, or different from, the conductive material 408 used to coat the surfaces of the core layer 404. In FIG. 4D, the plated core layer 404 is attached to a carrier 436 or temporary film.

In FIG. 4E, a discrete passive electronic component 106 is disposed in the cavity 432. In FIG. 4F, a mold material 124 is disposed to encapsulate the plated cavity 432, the plated core layer 404, and the prefabricated passive electronic component 106. The mold material 124 may be a low CTE mold material. The opening 434 for the THV is filled with the mold material 124. In FIG. 4G, the mold material 124 is ground down to the conductive material 108. In FIG. 4H, the plated core layer 404 and encapsulated passive component 106 are detached from the carrier 436 and the substrate assembly is shown flipped.

Figure 4I:
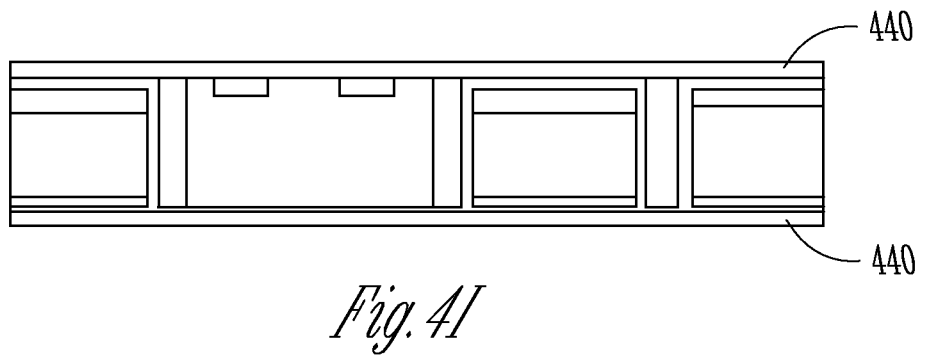
Figure 4J:
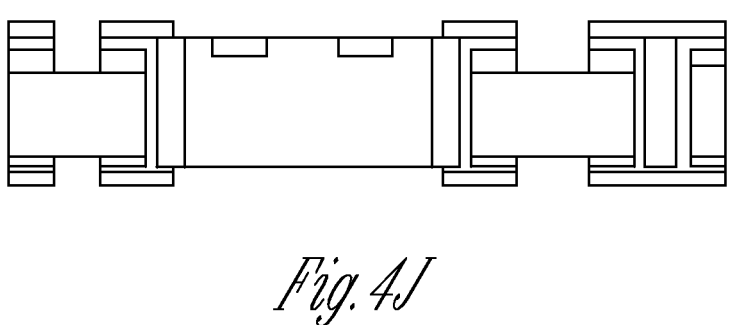
Figure 4K:
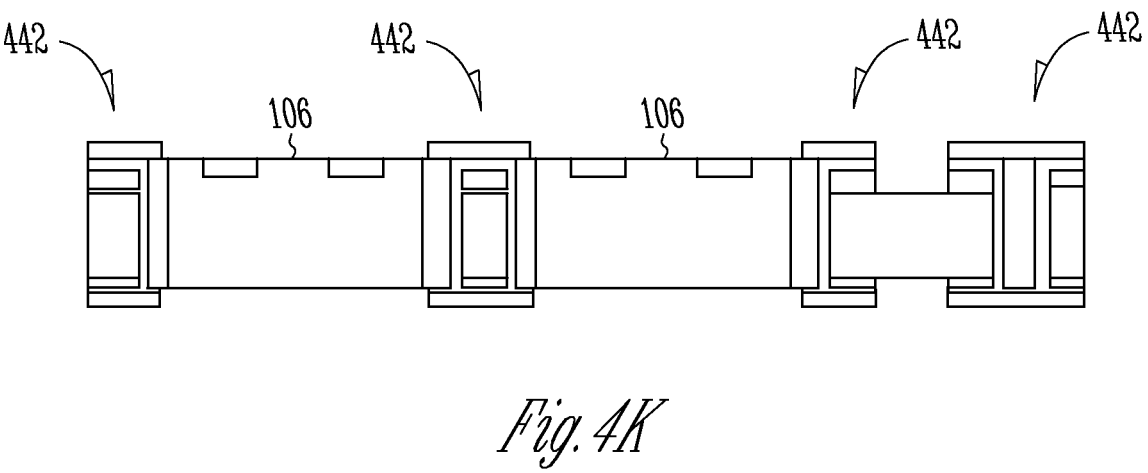

FIG. 4I shows lid plating 440 added to the top and bottom surfaces of the substrate assembly. In FIG. 4J, portions of the lid plating are removed (e.g., by etching) from the top and bottom surfaces of the substrate assembly. FIG. 4K shows the substrate assembly with discrete passive components 106, cavity sidewall connections 442, and through via 444. It can be seen in FIG. 4K that the cavity sidewall connections 442 provide electrical continuity between the lid plate on the top surface of the substrate assembly and the lid plate on the bottom surface of the substrate assembly.

Figure 5:
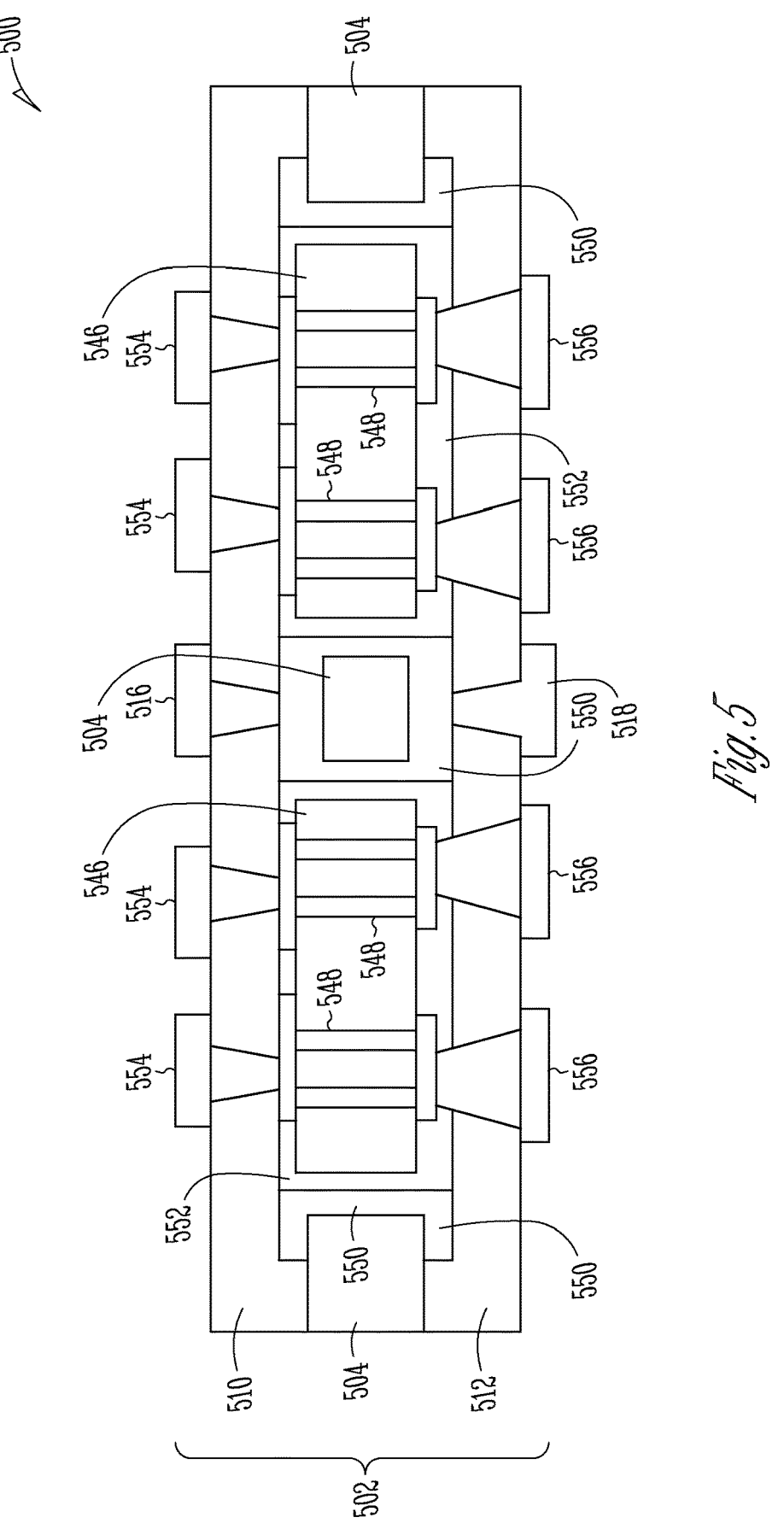
FIG. 5 is an illustration of a cross section side view of another example of an electronic device in accordance with some embodiments.

FIG. 5 is an illustration of a cross section side view of another example of an electronic device 500. The device 500 includes a substrate 502 that includes a glass core layer 504. Cavities are formed in the glass core layer 504 and a prefabricated or discrete passive component is disposed in the cavities. The passive electronic component is a coax magnetic inductor layer (CMIL) structure. The CMIL structure includes a magnetic material 546 and two through holes 548 in the magnetic material 546. A mold material 552 may encapsulate the CMIL structures.

The example of FIG. 5 shows two cavities and one prefabricated CMIL structure in each cavity for simplicity of the drawing. The CMIL structures may be formed by depositing the magnetic material 564 in the cavities (e.g., forming a plug in the cavities) and then drilling openings for the through holes 548 in the magnetic material 546. But forming the cavities and drilling the through holes is challenging for this to work for a glass core given the brittle nature of glass materials. Depositing prefabricated CMIL structures in the cavities may be a more straightforward approach.

The substrate 502 includes a dielectric layer 510 on top of the glass core layer 504 and a dielectric layer 512 below the glass core layer 504. The sidewalls 550 of the cavities are coated with a conductive material to form cavity sidewall connections through the glass core layer 504 and dielectric layers 510, 512. The cavity sidewall connections provide electrical continuity from the conductive cavity sidewalls to a top surface contact pad 516 of the substrate 502 and a bottom surface contact pad 518 of the substrate 502 (not all of the connectivity to the cavity sidewall connections is shown in FIG. 5). The substrate 502 may include more than one dielectric layer above or below the core layer 504. In certain examples, the substrate 502 can include an RDL above or below the core layer 504. The prefabricated CMIL structures include contact pads 554 on the top surface of the substrate 502 and contact pads 556 on the bottom surface of the substrate 502.

Using prefabricated inductors can provide high magnetic permeability inductors for circuits that provide power to electronic systems. Using cavity sidewall connections can provide low footprint connections between the top surface and the bottom surface of package substrates of the electronic systems.

Figure 6:
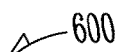
FIG. 6 is an illustration of a cross section side view of another example of an electronic device in accordance with some embodiments.
Figure 6:
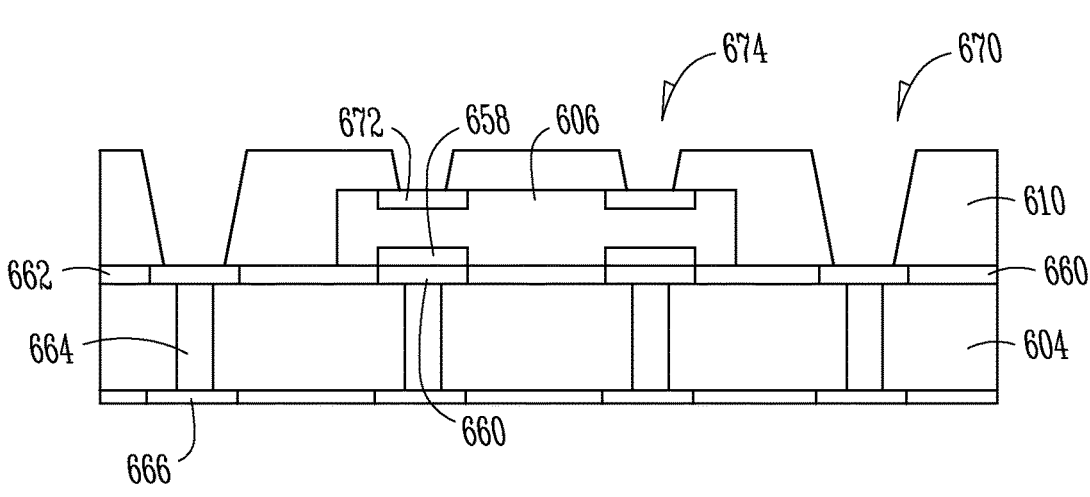

FIG. 6 is an illustration of a cross section side view of another example of an electronic device 600. The device 600 includes a substrate having a glass core layer 604 and contact pads 660 on the top surface of the glass core layer 604. One or more discrete passive components 606 are disposed on the first surface of the glass core layer 604. The discrete passive components 606 may include one or both of capacitors and inductors. The discrete passive components 606 may be smaller integrated circuit dies (e.g., tiles, chiplets, etc.) providing more specific functionality than a general microprocessor. For example, discrete passive components 606 may be tiles or chiplets providing voltage/power regulation functionality and include one or both of capacitors and inductors. The example shows one discrete passive component 606 to simplify the drawings, but an actual implementation may include many discrete passive components 606. The discrete passive component 606 includes bottom contacts pads 658 on the bottom surface of the component. The device 600 includes hybrid bonds between the contact pads 660 of the glass core layer and the bottom contact pads 658 of the discrete passive electronic component.

The substrate includes a thin film dielectric layer 662 on the top surface of the glass core layer 604 to make the hybrid bond and the discrete passive component 606 includes a similar or matching dielectric material. The thin film dielectric material can be a silicon-based thin film dielectric material. In certain examples, the thin film dielectric material includes one of silicon dioxide, silicon nitride, or silicon carbon nitride. To make a hybrid bond, a dielectric-to-dielectric bond between the thin film dielectric layer 662 and the discrete passive component 606 is made first with the conductive material (e.g., copper) of the contact pads 660 slightly recessed. As the temperature is increased, the conductive material of the contact pads 660 expands in the vertical direction to form a contact-to-contact bond with contact pads 658.

The substrate includes through glass vias (TGVs) 664 that extend through the glass core layer 604. The TGVs 664 can provide electrical continuity to contact pads 666 on the bottom surface of the glass core layer 604. The bottom surface of the glass core layer 604 may also include a thin film dielectric layer 662 that can be used for hybrid bonding on the bottom surface of the glass core layer 604.

The substrate includes a second thicker dielectric layer 610 on the top surface of the glass core layer 604 and over the discrete passive electronic component 606. The dielectric material of the top dielectric layer 610 may be the same or different from the dielectric material of the thin film dielectric layer 662. The example substrate shows openings 670 in the top dielectric layer 610 that extend to the contact pads 660 on the top surface of the glass core layer 604. The openings 670 can be used to form vias to the TGVs 664.

The discrete passive component 606 includes top contacts pads 672 on its top surface. The top dielectric layer 610 shows openings 674 that extend to the top contact pads 672. The openings 674 can be used to form vias in the dielectric layer 610 to the discrete passive component 606. The top dielectric layer 610 may be a redistribution layer (RDL) with additional layers of electrical interconnect that run horizontal to the vias. Alternative structures for the substrate can be used.

Figure 7:
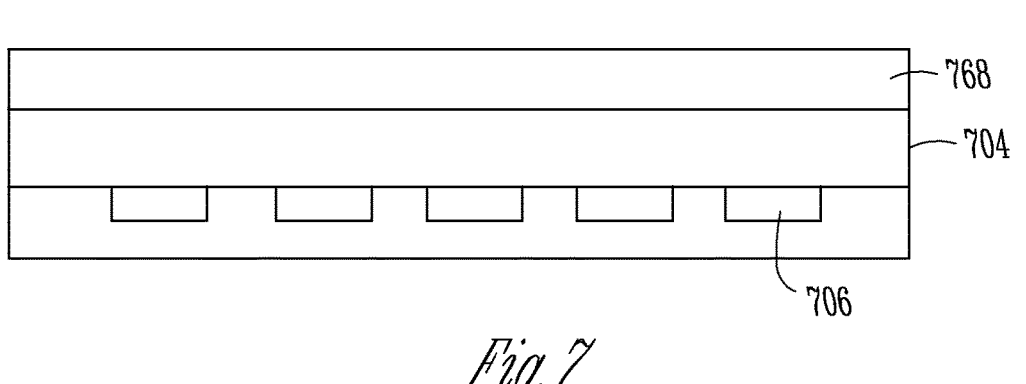
FIG. 7 is an illustration of a cross section side view of another example of an electronic device in accordance with some embodiments.

FIG. 7 is an illustration of a cross section side view of another example of an electronic device 700. The device 700 includes a substrate having a glass core layer 704 and one or more discrete passive components 706 disposed on the bottom surface of the glass core layer 704. Hybrid bonding can be used to attach the discrete passive components 706 to the bottom surface. An RDL 768 is formed on the top surface of the glass core layer 704. Attaching the discrete passive components 706 on the bottom or backside frees up real estate on the top or front side of the substrate for fanout routing layers of the RDL 768.

Figure 8A:
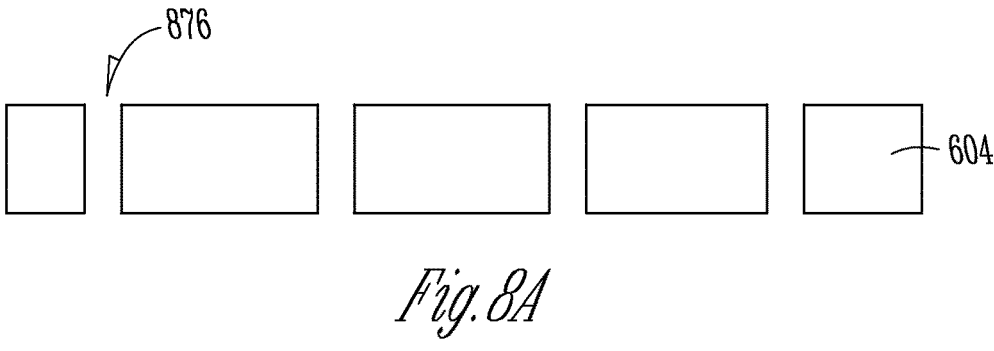
FIGS. 8A-8G illustrate a flow diagram of an example of a method of manufacture of an electronic device in accordance with some embodiments.
Figure 8B:
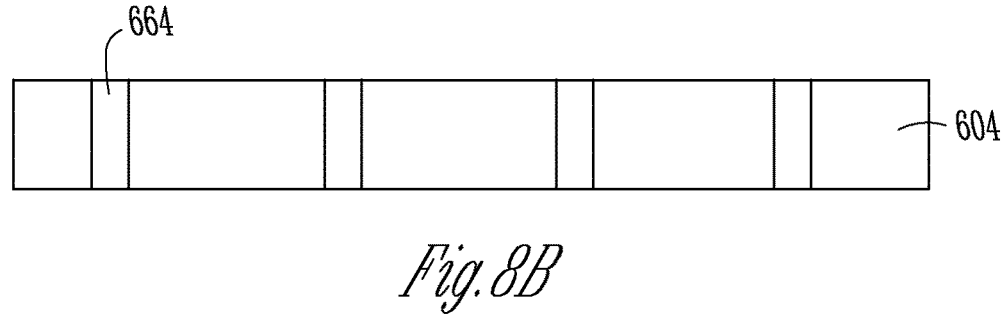
Figure 8C:
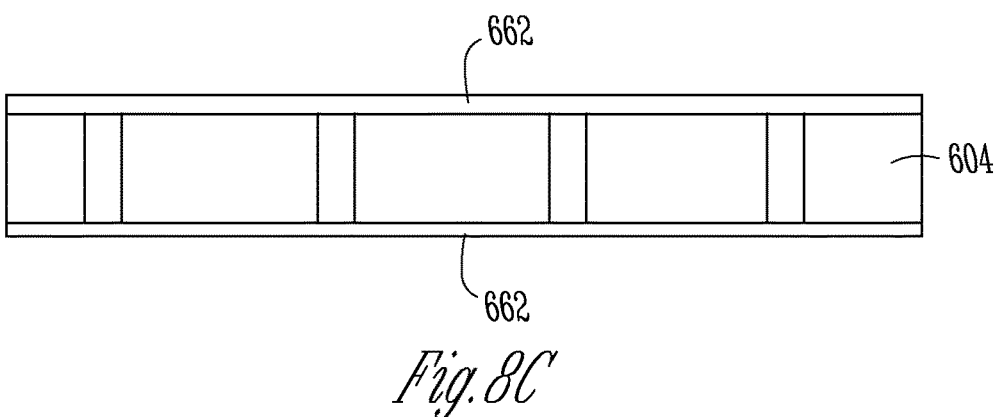

FIGS. 8A-8G illustrate a flow diagram of an example of a method of manufacture of an electronic device, such as the electronic device 600 of FIG. 6. FIG. 8A is a side view of a glass core layer 604 for the substrate of the electronic device 600, and through holes formed 876 in the glass core layer 604. In FIG. 8B, the through holes 876 are filled with conductive material (e.g., a metal) to form TGVs 664 in the glass core layer 604. In FIG. 8C, a thin film dielectric layer 662 is formed on the top surface of the glass core layer 604 and the bottom surface of the glass core layer. Contact pads are formed on the top surface of the glass core layer 604.

Figure 8D:
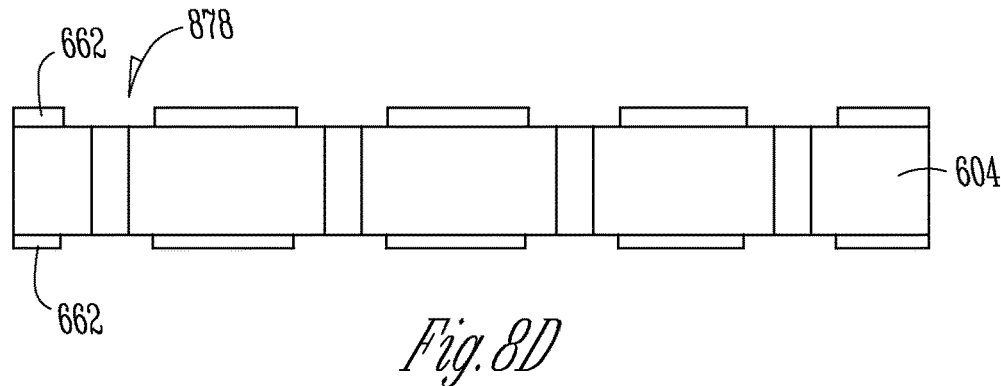
Figure 8E:
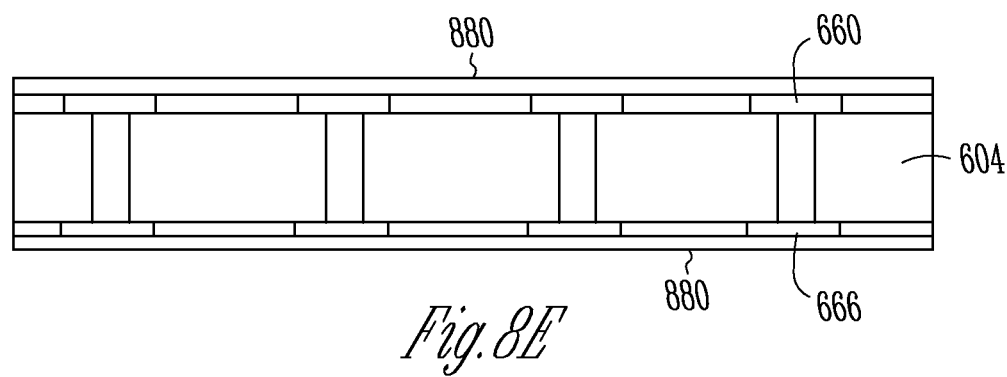
Figure 8F:
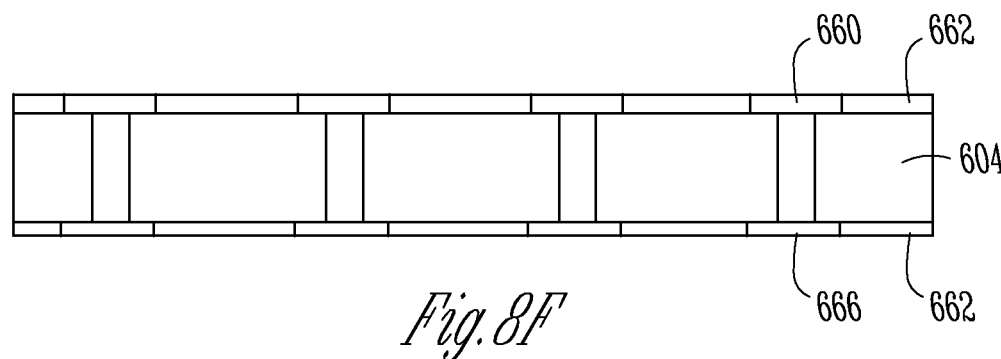

In FIG. 8D, openings 878 are formed in the thin film dielectric layers 662. In FIG. 8E a metal over-plating layer 880 is disposed on the top and bottom surfaces of the glass core layer 604. In FIG. 8F, the over-plating layer 880 is polished to leave the contact pads 660 and 666. One or both of the sets of contracts pads 660, 666 may be recessed (e.g., 1-2 microns) from the outer surfaces of the thin film dielectric layers 662.

Figure 8G:
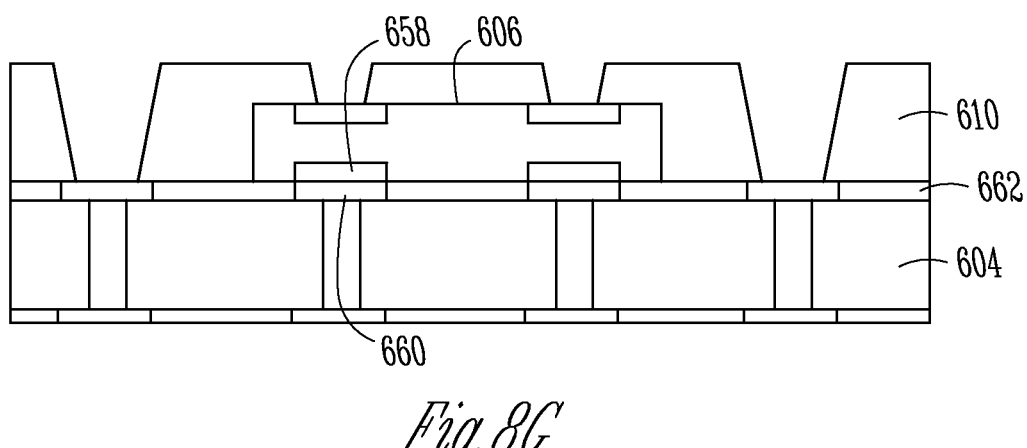

In FIG. 8G, one or more discrete passive electronic components 606 are disposed on the top thin film dielectric layer 662. The discrete passive electronic components 606 may be included in chiplets. Hybrid bonds are formed between the contact pads 660 on the top surface of the glass core layer 604 and contact pads 658 of the discrete passive component 606. To form the hybrid bonds the dielectric material of the discrete passive electronic component 606 is bonded to the thin film dielectric layer 662. The glass core layer 604 and the discrete passive component 606 are heated to bond the contact pads 660 of the glass core layer 604 and the bottom contact pads 658 of the discrete passive component 606. The top dielectric layer 610 can be formed on glass core layer 604 and the discrete passive component 606 before or after the hybrid bonds are formed.

Hybrid bonding is another technique to use prefabricated inductors or capacitors to provide high magnetic permeability inductors for circuits that provide power to electronic systems. The hybrid bonding of the discrete inductors or capacitors is compatible with glass layer processing. Another approach to provide high magnetic permeability inductors for circuits that provide power to electronic systems is to embed the discrete passive components in the buildup layers (e.g., an RDL). The discrete passive components can be dual-sided.

Figure 9:
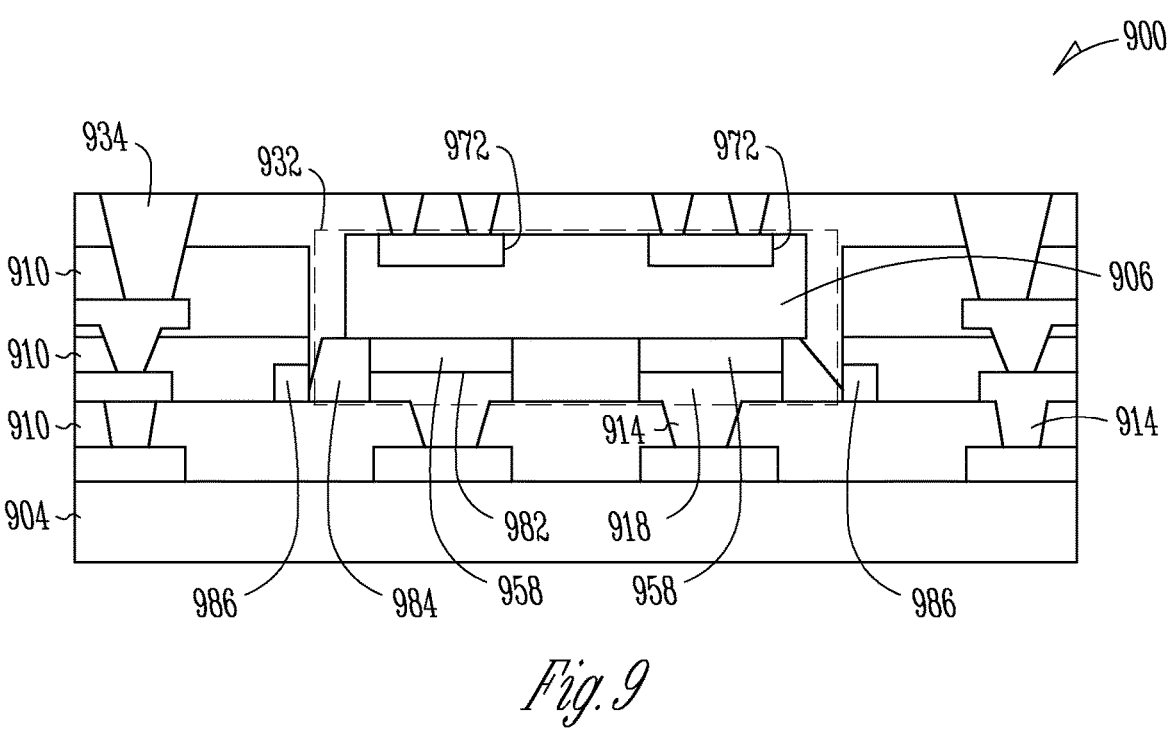
FIG. 9 is an illustration of a cross section side view of another example of an electronic device in accordance with some embodiments.

FIG. 9 is an illustration of a cross section side view of another example of an electronic device 900. The device 900 includes a substrate that includes a core layer 904. The core layer 904 may be a glass core layer or an organic core layer. The device 900 also includes buildup layers 910 of buildup material on a top surface of the core layer 904. The buildup layers 910 can include electrically conductive interconnect within an organic buildup material. The electrically conductive interconnect can include vias 914 and horizontal conductive traces 968. The example of FIG. 9 also shows openings 934 that can be filled with an electrically conductive material (e.g., a metal) to form vias to the top surface of the buildup material. Contact pads (not shown) can be formed on the top surface of the buildup material to contact the vias.

A cavity 932 is formed in at least a portion of the buildup layers 910. The cavity 932 includes contact pads 918 formed on the bottom of the cavity 932 below the top surface of the buildup layers 910. A discrete passive electronic component 906 is disposed in cavity 932 of the buildup layers 910. The discrete component 906 can include inductors, capacitors, or both inductors and capacitors. In certain examples, the discrete component is a chiplet that includes one or both of inductors and capacitors.

The discrete component 906 is a dual-sided component and includes top contact pads 972 on its top surface and bottom contact pads 958 on its bottom surface. The contact pads provide electrical contact to the passive electronic device or devices of the dual-sided component. Solder joints 982 bond the bottom contact pads 958 of the discrete component to the contact pads 918 within the cavity 932. Vias contact the top contact pads 972 and connect the top contact pads 972 to contact pads on the top surface of the buildup layers.

Laser drilling can be used to make the cavity 932. In some examples, a laser ablation stop is formed in the buildup layers. The laser ablation stop can be a metal such as titanium. After the cavity 932 is drilled, the laser ablation stop can be removed (e.g., by etching). In some examples, a portion of the laser ablation stop is removed and a frame 986 of the metal from the laser ablation stop (or part of a frame) remains around the periphery of the bottom of the cavity in one or more of the buildup layers 910.

An underfill material 984 may be disposed to underfill the discrete component 906 to form a reliable solder joint. The rest of the cavity can be filled with buildup material (e.g., epoxy) to encapsulate the discrete component 906. The underfill material 984 will have a different filler size and size distribution compared to the surrounding buildup material. In certain examples, there may be a thin film adhesion layer (example a silicon nitrate layer) between the underfill material 984 and the encapsulating buildup material.

Figure 10:
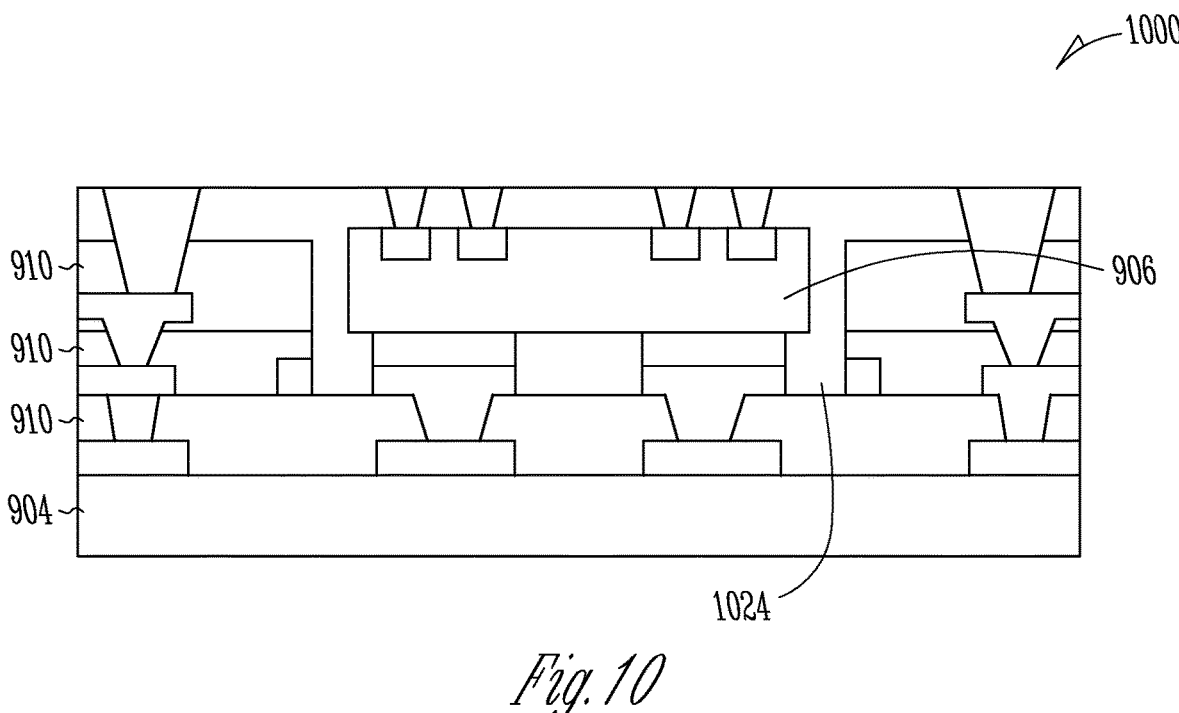
FIG. 10 is an illustration of a cross section side view of another example of an electronic device in accordance with some embodiments.

FIG. 10 is an illustration of a cross section side view of another example of an electronic device 1000. Like the device 900 of FIG. 9, the device 1000 of FIG. 10 includes a substrate that includes a core layer 904 and buildup layers 910 of buildup material on the top surface of the core layer 904. A cavity 932 is formed in the buildup layers 910 and a discrete passive electronic component 906 is disposed in the cavity 932. In the example of FIG. 10, a mold material 1024 is used to underfill and encapsulate the discrete component 906.

Figures 11A, 11B, 11C, 11D, 11E, 11F, 11G:
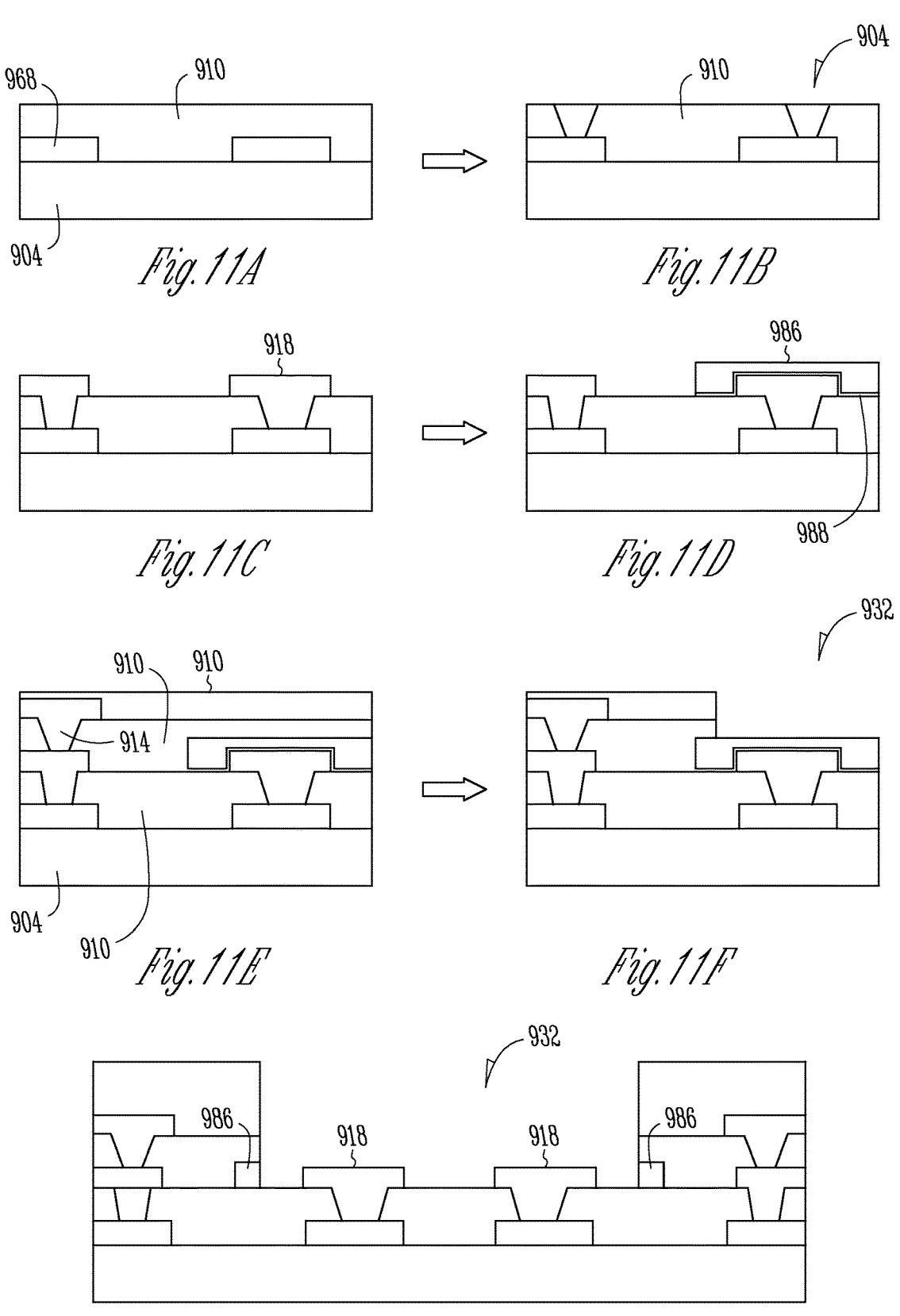
FIGS. 11A-11I illustrate a flow diagram of an example of a method of manufacture of an electronic device in accordance with some embodiments.

FIGS. 11A-11I illustrate a flow diagram of another example of a method of manufacture of an electronic device, such as the electronic device 900 of FIG. 9. In FIG. 11A, a buildup layer 910 is formed on a core layer 904. The buildup layer 910 includes electrically conductive interconnect 968 in a buildup material. The buildup material may be an organic material such as plastic or epoxy. The core layer 904 can be a glass core layer or an organic core layer.

In FIG. 11B, openings 934 for vias are formed in the buildup layer 910. In FIG. 11C, the openings 934 are filled to form vias and the buildup layer 910 is plated with a conductive material. A lithography process can be used to pattern the plating. One of the contact pads 918 for the bottom of the cavity is shown. In FIG. 11D, the contact pad 918 is coated with a layer of titanium 988. The titanium is plated with a metal layer 986 to form a laser ablation stop.

In FIG. 11E, additional buildup layers are formed on the core layer 904 and another via 914 is formed in the layers. In FIG. 11F, the cavity 932 is formed in the buildup layers by laser drilling to the laser ablation stop. In FIG. 11G, the layers 986, 988 of the laser ablation stop are removed and the cavity 932 is formed with bottom contact pads 918 on the bottom of the cavity 932. In the example of FIG. 11G, a portion of the metal layer 986 remains as a frame around the bottom of the cavity 932.

Figure 11H:
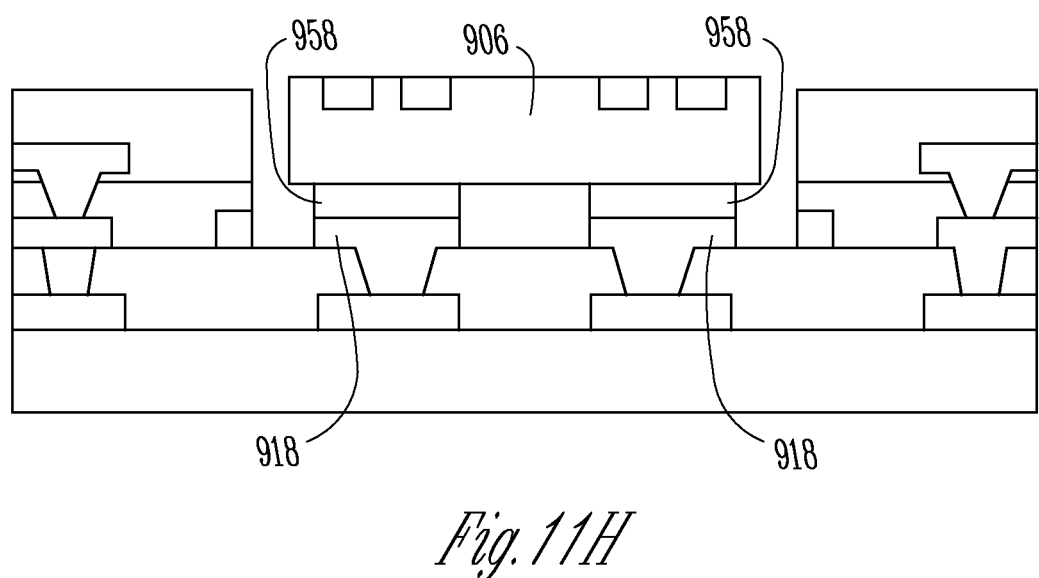

In FIG. 11H, the discrete component 906 is disposed in the cavity 932. The bottom contact pads 958 of the discrete component 906 are bonded to the contacts pads 918 on the bottom of the cavity 932. In some examples, thermal compression bonding (TCB) is used to form solder joints to bond the bottom contact pads 918 within the cavity 932. To form the solder joints, the contact pads 918 may first be coated with a solder-like material (e.g., a nickel-tin multi-layer coating or a nickel-palladium-gold layer.

Figure 11I:
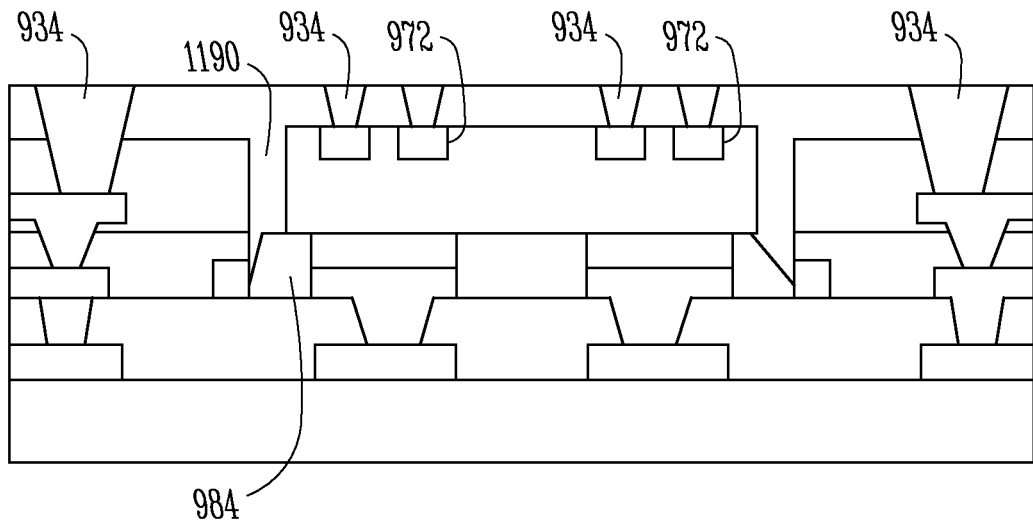

In FIG. 11I, the discrete component 906 is underfilled using an underfill material 984. An organic buildup material 1190 is disposed on the discrete component 906 to encapsulate the discrete component 906 and form a top surface of the buildup layers. Openings 934 are formed in the build material to form vias to the top contact pads 972 of the discrete component 906. Contact pads can be formed on the top surface that are electrically connected to the top contact pads 972 of the discrete component 906.

Figure 12A:
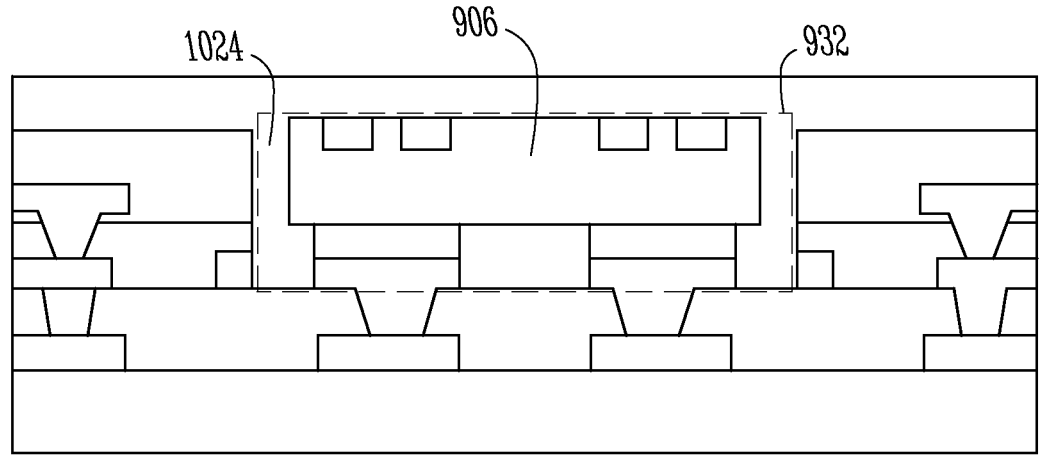
FIGS. 12A-B illustrate portions of another example of a method of manufacture of an electronic device in accordance with some embodiments.
Figure 12B:
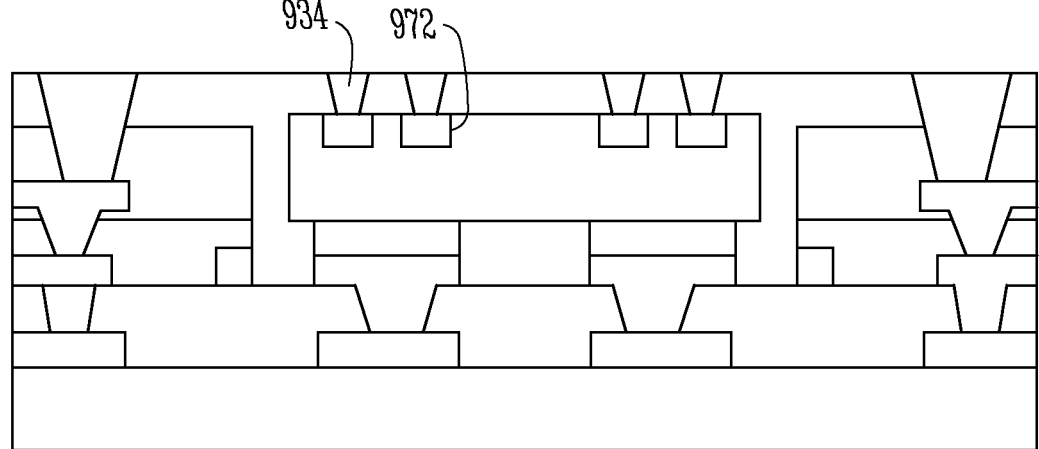

FIGS. 12A-B show an alternative method to encapsulate the discrete component 906 in the buildup layers. In FIG. 12A, a mold material 1024 is disposed in the cavity 932 to both underfill and encapsulate the discrete component 906. In FIG. 12B, openings 934 are formed in the mold material to form vias to the top contact pads 972 of the discrete component 906.

Figure 13:
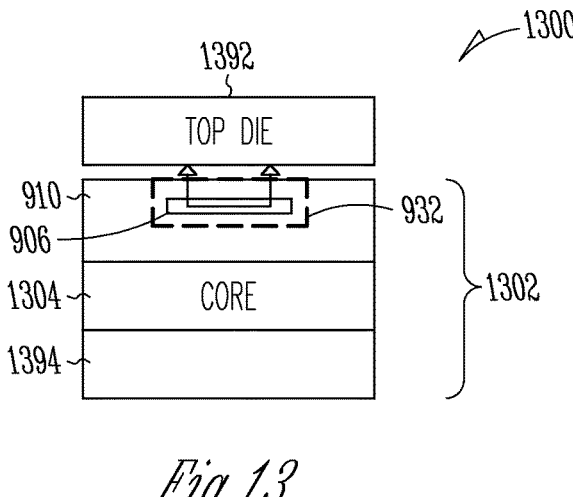
FIG. 13 is an illustration of portions of an example of an electronic system in accordance with some embodiments.

FIG. 13 is an illustration of portions of an example of an electronic system 1300 that includes an integrated circuit (IC) die 1392 on the top of a substrate 1302. The IC die 1392 includes one or more active components (e.g., one or more transistors). The substrate 1302 includes a core layer 904, front side or top side buildup layers 910, and backside or bottom side buildup layers 1394. The core layer 904 and buildup layers 910 of the substrate 1302 can be either of the examples of FIGS. 9 and 10. The core layer 904 can be either a glass layer or a layer of organic material. The substrate 1302 includes a discrete passive electronic component 906 encapsulated in a cavity 932 of the top side buildup layers 910. The discrete component may be used in a voltage regulator circuit to provide a regulated circuit supply to the IC die 1392.

Figure 14:
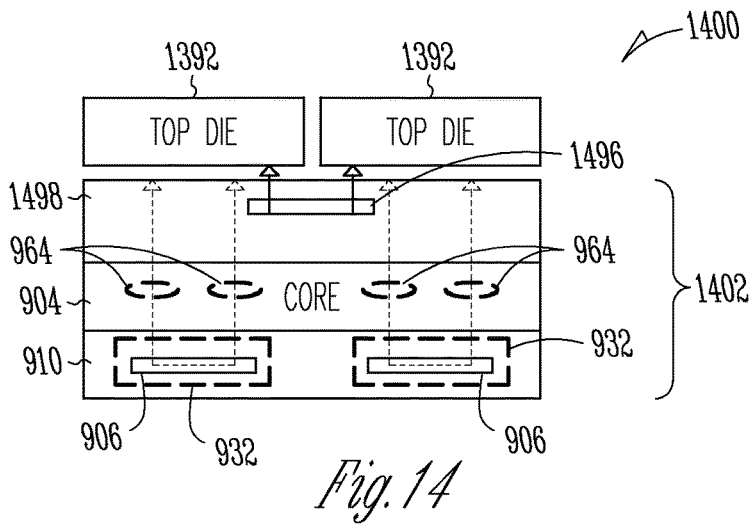
FIG. 14 is an illustration of portions of another example of an electronic system in accordance with some embodiments.

FIG. 14 is an illustration of another example of an electronic system 1400. The system 1400 includes two IC dies 1392 attached to a substrate 1402. The IC dies 1392 include one or more active components. The substrate 1402 includes a core layer 904, top side buildup layers 1498, and bottom side buildup layers 910. The top side build up layers 1498 include an embedded multi-die interconnect bridge (EMIB) 1496 embedded in the top side buildup layers 1498. The EMIB is a one-sided device having contact pads on the top side to provide interconnect between the two IC dies 1392.

The substrate 1402 includes two discrete passive electronic components 906. The discrete components 906 includes passive electronic circuit elements (e.g., one or both of inductors and capacitors) that can be used in regulator circuits for the IC dies 1392. Because the EMIB connection is in the top side buildup layers 1498, the discrete components 906 can be located in the bottom side buildup layers 910. Cavities for the EMIB 1496 and the discrete components 906 can be formed using similar methods. The core layer 904 and bottom side buildup layers 910 can be either of the examples of FIG. 9 or 10 with the buildup layers 910 formed on the bottom surface of the core layer 904.

The core layer 904 can be either a glass core layer or an organic material core layer. If the core layer 904 is glass, the core layer 904 can include TGVs 964 to provide an electrical connection between the bottom side buildup layer 910 and the top side buildup layers 1498, and between the discrete components 906 and the IC dies 1392. If the core layer 904 is an organic material, the electrical connection between the bottom side buildup layer 910 and the top side buildup layers 1498 can be provided by through vias in the core layer 904.

Figure 15:
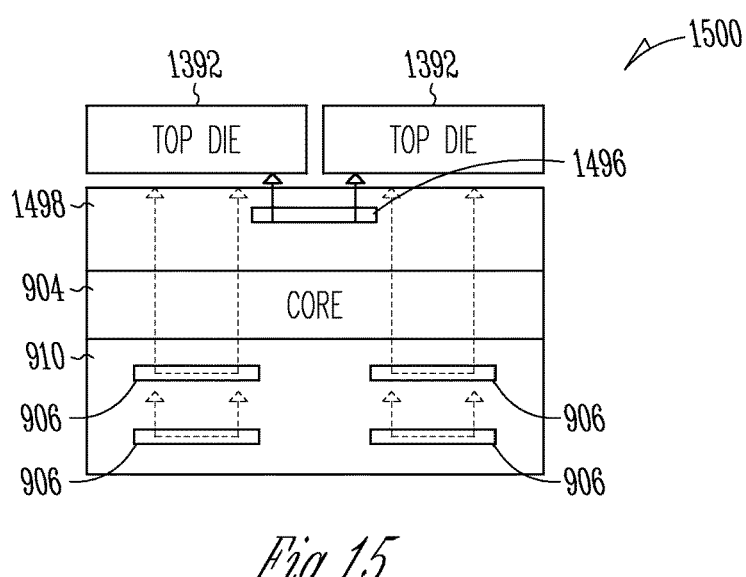
FIG. 15 is an illustration of portions of another example of an electronic system in accordance with some embodiments.

FIG. 15 is an illustration of another example of an electronic system 1500. The system 1500 is the same as in the example of FIG. 4 except that the bottom side buildup layers 910 include discrete passive electronic components 906 that are stacked on top of each other. The discrete components 906 may be stacked in the same cavity or in different cavities formed for each of the discrete component 906. In some examples, the discrete passive electronic components 906 are an inductor and a capacitor that are used for energy storage in regulator circuits for the IC dies 1392.

The bonding within a cavity process is another technique to use prefabricated inductors or capacitors to provide high magnetic permeability inductors for circuits that provide power to electronic systems. The bonding technique provides a dual-sided embedded connection for the prefabricated inductors or capacitors.

Figure 16:
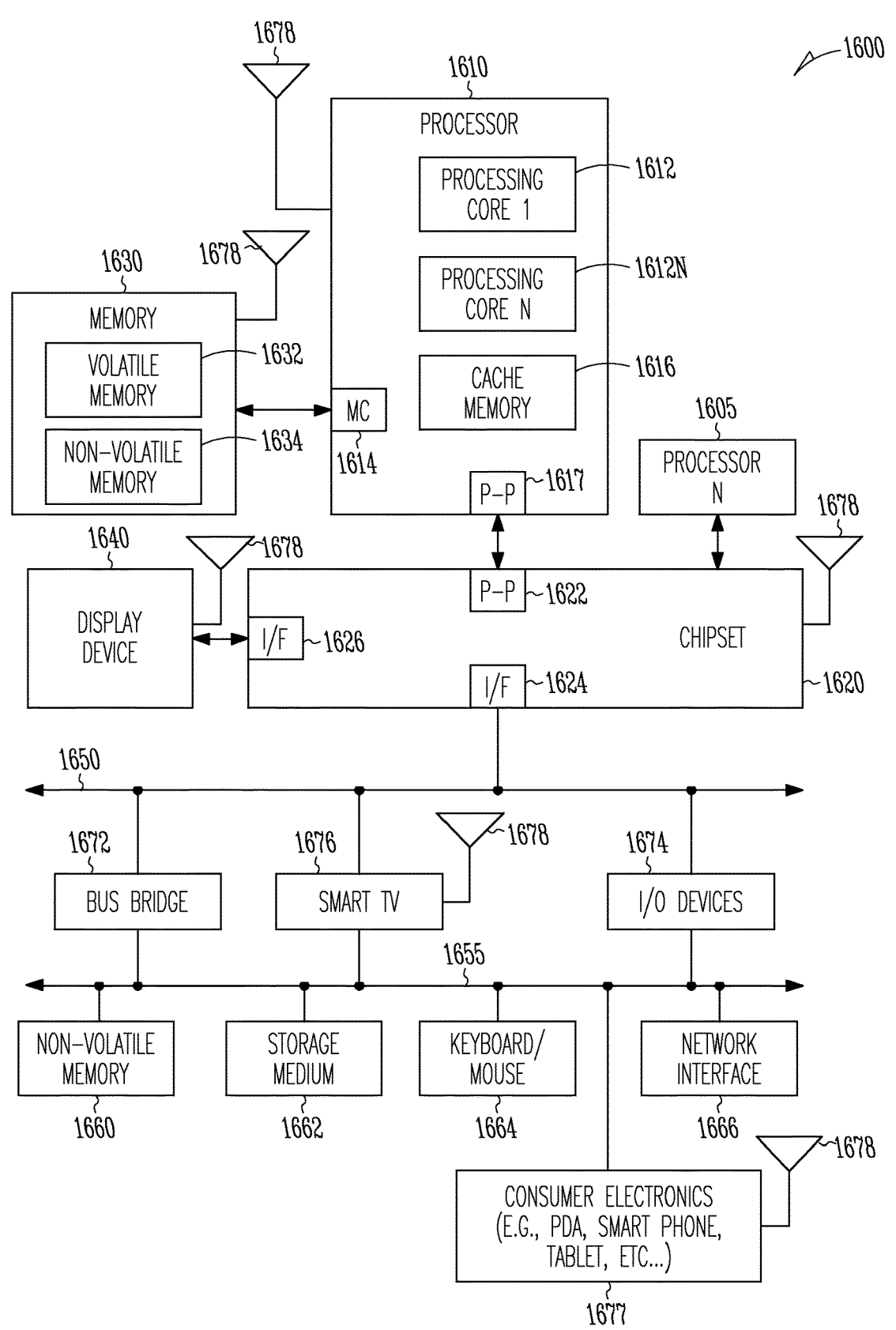
FIG. 16 illustrates a system level diagram in accordance with some embodiments.

FIG. 16 illustrates a system level diagram, according to one embodiment of the present disclosure. For instance, FIG. 16 depicts an example of a system that can include an electronic device packaged with a substrate having a core layer. The core layer can include one or more of a cavity sidewall connection, discrete passive components embedded in the core layer, and discrete components hybrid bonded to the core layer. The core layer may be a glass core layer. In one embodiment, system 1600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance, or any other type of computing device. In some embodiments, system 1600 is a system on a chip (SOC) system. In one example, two or more systems as shown in FIG. 16 may be provided circuit power using components attached to a back side of a package substrate as described in the present disclosure.

In one embodiment, processor 1610 has one or more processing cores 1612 and 1612N, where N is a positive integer and 1612N represents the Nth processor core inside processor 1610. In one embodiment, system 1600 includes multiple processors including 1610 and 1605, where processor 1605 has logic similar or identical to the logic of processor 1610. In some embodiments, processing core 1612 includes, but is not limited to, pre-fetch logic to fetch instructions, decode logic to decode the instructions, execution logic to execute instructions and the like. In some embodiments, processor 1610 has a cache memory 816 to cache instructions and/or data for system 1600. Cache memory 1616 may be organized into a hierarchal structure including one or more levels of cache memory.

In some embodiments, processor 1610 includes a memory controller 1614, which is operable to perform functions that enable the processor 1610 to access and communicate with memory 1630 that includes a volatile memory 1632 and/or a non-volatile memory 1634. In some embodiments, processor 1610 is coupled with memory 1630 and chipset 1620. Processor 1610 may also be coupled to a wireless antenna 1678 to communicate with any device configured to transmit and/or receive wireless signals. In one embodiment, the wireless antenna interface 1678 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, volatile memory 1632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1634 includes, but is not limited to, flash memory, phase change memory (PCM), read-only memory (ROM), electrically erasable programmable read-only memory (EEPROM), or any other type of non-volatile memory device.

Memory 1630 stores information and instructions to be executed by processor 1610. In one embodiment, memory 1630 may also store temporary variables or other intermediate information while processor 1610 is executing instructions. In the illustrated embodiment, chipset 1620 connects with processor 1610 via Point-to-Point (PtP or P-P) interfaces 1617 and 1622. Chipset 1620 enables processor 1610 to connect to other elements in system 1600. In some embodiments, interfaces 1617 and 1622 operate in accordance with a PtP communication protocol such as the Intel® QuickPath Interconnect (QPI) or the like. In other embodiments, a different interconnect may be used.

In some embodiments, chipset 1620 is operable to communicate with processor 1610, 1605N, display device 1640, and other devices 1672, 1676, 1674, 1660, 1662, 1664, 1666, 1677, etc. Buses 1650 and 1655 may be interconnected together via a bus bridge 1672. Chipset 1620 connects to one or more buses 1650 and 1655 that interconnect various elements 1674, 1660, 1662, 1664, and 1666. Chipset 1620 may also be coupled to a wireless antenna 1678 to communicate with any device configured to transmit and/or receive wireless signals. Chipset 1620 connects to display device 1640 via interface (I/F) 1626. Display 1640 may be, for example, a touchscreen, a liquid crystal display (LCD), a plasma display, cathode ray tube (CRT) display, or any other form of visual display device. In some embodiments, processor 1610 and chipset 1620 are merged into a single SOC. In one embodiment, chipset 1620 couples with (e.g., via interface 1624) a non-volatile memory 1660, a mass storage medium 1662, a keyboard/mouse 1664, and a network interface 1666 via I/F 824 and/or I/F 1626, I/O devices 1674, smart TV 1676, consumer electronics 1677 (e.g., PDA, Smart Phone, Tablet, etc.).

In one embodiment, mass storage medium 1662 includes, but is not limited to, a solid state drive, a hard disk drive, a universal serial bus flash memory drive, or any other form of computer data storage medium. In one embodiment, network interface 1666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 16 are depicted as separate blocks within the system 1600, the functions performed by some of these blocks may be integrated within a single semiconductor circuit or may be implemented using two or more separate integrated circuits. For example, although cache memory 1616 is depicted as a separate block within processor 1610, cache memory 1616 (or selected aspects of 1616) can be incorporated into processor core 1612.

The devices, systems, and methods described can provide improved routing of power and reduced size of a multichip package by providing high magnetic permeability components for the circuits that produce the power with the substrate.

To better illustrate the method and apparatuses disclosed herein, a non-limiting list of embodiments is provided here:

Example 1 includes subject matter (such as an electronic device) a substrate including a core layer, a cavity formed in the core layer having sidewalls plated with a conductive material, a prefabricated passive electronic component disposed in the cavity, and a cavity sidewall connection providing electrical continuity from the plated cavity sidewalls to a first surface of the substrate and to a second surface of the substrate.

In Example 2, the subject matter of Example 1 optionally includes a core layer that is a glass core layer.

In Example 3, the subject matter of Example 2 optionally includes a substrate including at least one first dielectric layer on a first surface of the glass core layer; a first contact pad on the at least one first dielectric layer; at least one second dielectric layer formed on a second surface of the glass core layer; a second contact pad on the at least one second dielectric layer; and the cavity sidewall connection providing electrical continuity between the cavity sidewalls, the first contact pad, and the second contact pad.

In Example 4, the subject matter of Example 3 optionally includes the prefabricated passive electronic component being a discrete inductor having first and second electrical contacts to the first surface of the substrate.

In Example 5, the subject matter of one or both of Examples 3 and 4 optionally includes multiple first contact pads on the first surface of the substrate in electrical contact with multiple cavity sidewall connections, wherein the first contact pads are connected together as a single net connection.

In Example 6, the subject matter of one or any combination of Examples 3-5 optionally includes a prefabricated passive electronic component includes at least one contact on the first surface of the substrate and at least one second contact on the second surface of the substrate.

In Example 7, the subject matter of Example 6 optionally includes a prefabricated passive electronic component that is a coax magnetic inductor layer (CMIL) structure.

In Example 8, the subject matter of one or any combination of Examples 1-5 optionally includes a prefabricated passive electronic component that is a discrete inductor having first and second electrical contacts to a first surface of the substrate.

In Example 9, the subject matter of one or any combination of Examples 1-8 optionally includes a mold material between the plated cavity sidewalls and the prefabricated passive electronic component.

Example 10 includes subject matter (such as a method of forming an electronic device) or can optionally be combined with one or any combination of Examples 1-9 to include such subject matter, comprising forming a cavity in a substrate having a core layer; plating sidewalls of the cavity with a conductive material; disposing a prefabricated passive electronic component in the cavity; and forming a cavity sidewall connection in the substrate that provides electrical continuity between a first surface of the substrate and a second surface of the substrate via the plated cavity sidewalls.

In Example 11, the subject matter of Example 10 optionally includes forming a cavity in a substrate having a glass core layer, and the plating sidewalls includes plating sidewalls of the glass cavity with a layer of conductive material.

In Example 12, the subject matter of one or both of Examples 10 and 11 optionally includes disposing a discrete inductor in the cavity, and the discrete inductor includes first and second contacts electrically connected to contact pads on the first surface of the substrate.

In Example 13 the subject matter of one or both of Examples 11 and 12 optionally includes forming at least one first dielectric layer on a first surface of the glass core layer, forming a first contact pad on the at least one first dielectric layer, forming at least one second dielectric layer formed on a second surface of the glass core layer, and forming a second contact pad on the at least one second dielectric layer, wherein the first and second contact pads are electrically connected to the plated cavity sidewalls.

In Example 14, the subject matter of Example 13 optionally includes forming multiple first contact pads on the first surface of the substrate and multiple second contact pads on the second surface of the substrate; connecting the first contact pads together as a first single net connection; and connecting the second contact pads together as a second single net connection.

In Example 15, the subject matter of Example 11 optionally includes disposing a prefabricated coax magnetic inductor layer (CMIL) structure in the cavity, wherein the prefabricated CMIL structure includes a first contact pad on the first surface of the substrate and a second contact pad on the second surface of the substrate.

In Example 16, the subject matter of one or any combination of Examples 11-15 optionally includes forming a through glass via in the core layer and filling the through glass via with the conductive material.

In Example 17, the subject matter of Example 10 optionally includes forming a cavity in a substrate having a core layer of organic material and disposing a discrete inductor in the cavity and disposing a mold material between the plated cavity sidewalls and the discrete inductor.

In Example 18, the subject matter of Example 17 optionally includes disposing a discrete inductor in the cavity and disposing a mold material between the plated cavity sidewalls and the discrete inductor.

Example 19 includes subject matter (such as a package electronic system) or can optionally be combined with one or any combination of Examples 1-18 to include such subject matter, comprising a voltage regulator circuit including a discrete inductor and a substrate. The substrate includes a glass core layer, a cavity formed in the core layer and the discrete inductor disposed in the cavity, wherein the cavity includes sidewalls plated with a conductive material, and a cavity sidewall connection providing electrical continuity from the plated cavity sidewalls to a first surface of the substrate and to a second surface of the substrate.

In Example 20, the subject matter of Example 19 includes a substrate including at least one first dielectric layer on a first surface of the glass core layer; a first contact pad on the at least one first dielectric layer; at least one second dielectric layer formed on a second surface of the glass core layer; a second contact pad on the at least one second dielectric layer, wherein the cavity sidewall connection provides electrical continuity between the cavity sidewalls, the first contact pad, and the second contact pad; and third contact pads on the at least one first dielectric layer and connected to electrical contacts of the discrete inductor.

These non-limiting example embodiments can be combined in any permutation or combination. Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:

1. An electronic device comprising:
   a substrate including a core layer;
   a cavity within the core layer, wherein the cavity is defined by sidewalls of the core layer, and wherein at least a portion of the sidewalls includes a conductive material;
   a prefabricated passive electronic component in the cavity, wherein the prefabricated passive electronic component comprises a coax magnetic inductor layer (CMIL) structure; and
   a cavity sidewall connection comprising the conductive material on the cavity sidewalls and providing electrical continuity from a first surface of the substrate and to a second surface of the substrate.

2. The electronic device of claim 1, wherein the core layer is a glass core layer.

3. The electronic device of claim 2, wherein the substrate includes:
   at least one first dielectric layer on a first surface of the glass core layer;
   a first contact pad on the at least one first dielectric layer;
   at least one second dielectric layer on a second surface of the glass core layer;
   a second contact pad on the at least one second dielectric layer; and
   wherein the cavity sidewall connection provides electrical continuity between the cavity sidewalls, the first contact pad, and the second contact pad.

4. The electronic device of claim 3, wherein the prefabricated passive electronic component has first and second electrical contacts to the first surface of the substrate.

5. The electronic device of claim 3, including multiple first contact pads on the first surface of the substrate in electrical contact with multiple cavity sidewall connections, wherein the first contact pads are connected together as a single net connection.

6. The electronic device of claim 3, wherein the prefabricated passive electronic component includes at least one contact on the first surface of the substrate and at least one second contact on the second surface of the substrate.

7. The electronic device of claim 1, wherein the CMIL structure includes a first contact pad on the first surface of the substrate and a second contact pad on the second surface of the substrate.

8. The electronic device of claim 1, including a mold material between the conductive material on the cavity sidewalls and the prefabricated passive electronic component.

9. A method of making an electronic device, the method comprising:

forming a cavity in a core layer of a substrate;

plating sidewalls of the core layer that define the cavity with a conductive material;

disposing a prefabricated passive electronic component in the cavity, wherein the prefabricated passive electronic component comprises a coax magnetic inductor layer (CMIL) structure; and forming a cavity sidewall connection in the substrate that provides electrical continuity between a first surface of the substrate and a second surface of the substrate via the conductive material on the sidewalls.

10. The method of claim 9, wherein the forming the cavity in the substrate includes forming a cavity in a glass core layer, and wherein plating the sidewalls includes plating sidewalls of the glass core layer with a layer of the conductive material.

11. The method of claim 10, wherein the prefabricated passive electronic component:

includes first and second contacts electrically connected to contact pads on the first surface of the substrate.

12. The method of claim 10, wherein forming the cavity sidewall connection includes:

forming at least one first dielectric layer on a first surface of the glass core layer;

forming a first contact pad on the at least one first dielectric layer;

forming at least one second dielectric layer on a second surface of the glass core layer; and forming a second contact pad on the at least one second dielectric layer, wherein the first and second contact pads are electrically connected to the conductive material on the sidewalls.

13. The method of claim 12, including:

forming multiple first contact pads on the first surface of the substrate and multiple second contact pads on the second surface of the substrate;

connecting the first contact pads together as a first single net connection; and connecting the second contact pads together as a second single net connection.

14. The method of claim 10, wherein the CMIL structure includes a first contact pad on the first surface of the substrate and a second contact pad on the second surface of the substrate.

15. The method of claim 10, including forming a through glass via in the core layer and filling the through glass via with the conductive material.

16. The method of claim 9, wherein the forming the cavity in the core layer of the substrate includes forming a cavity in an organic material.

17. The method of claim 16, including forming contact pads on the first surface of the substrate, wherein the contact pads are electrically connected to the CMIL structure.

18. An electronic device comprising:

a substrate including a core layer;

a first prefabricated passive electronic component disposed in a first cavity within the core layer, wherein:

the first cavity is defined by a first sidewall of the core layer;

a conductive material is on the first sidewall of the core layer; and the first prefabricated passive electronic component comprises a first inductor structure;

a second prefabricated passive electronic component disposed in a second cavity within the core layer and adjacent to the first cavity, wherein:

the second cavity is defined by a second sidewall of the core layer;

the conductive material is on the second sidewall of the core layer; and the second prefabricated passive electronic component comprises a second inductor structure; and a cavity sidewall connection located between the first and second cavities and providing electrical continuity between a first surface of the core layer and a second surface of the core layer through the conductive material on at least one of the first sidewall and the second sidewall of the core layer.

19. The electronic device of claim 18, wherein the cavity sidewall connection comprises the conductive material on both of the first sidewall and the second sidewall.

20. The electronic device of claim 18, wherein:

the first inductor structure is a first coax magnetic inductor layer (CMIL) structure;

the second inductor structure is a second CMIL structure;

each of the first and second CMIL structures comprise at least one through hole extending through a magnetic material; and the core layer is glass.

* * * * *